United States Patent
Drowley et al.

[19]

[11] Patent Number: 6,100,556
[45] Date of Patent: Aug. 8, 2000

[54] METHOD OF FORMING A SEMICONDUCTOR IMAGE SENSOR AND STRUCTURE

[75] Inventors: Clifford I. Drowley, Phoenix, Ariz.; Robert M. Guidash, Rush, N.Y.; Mark S. Swenson, Higley, Ariz.

[73] Assignees: Motorola Inc., Schaumburg, Ill.; Eastman Kodak Co., Rochester, N.Y.

[21] Appl. No.: 08/970,703

[22] Filed: Nov. 14, 1997

[51] Int. Cl.[7] .................................................. H01L 29/72
[52] U.S. Cl. .......................... 257/292; 257/233; 257/234; 438/73
[58] Field of Search .................................. 257/233, 234, 257/292; 438/73

[56] References Cited

U.S. PATENT DOCUMENTS

| | | | |
|---|---|---|---|
| 4,484,210 | 11/1984 | Shiraki et al. . | |
| 4,831,426 | 5/1989 | Kimata et al. | 257/233 |
| 5,191,399 | 3/1993 | Maegawa et al. | 257/233 |
| 5,202,907 | 4/1993 | Yonemoto | 377/60 |
| 5,306,931 | 4/1994 | Stevens | 257/233 |
| 5,446,297 | 8/1995 | Lee | 257/223 |
| 5,514,887 | 5/1996 | Hokari | 257/233 |
| 5,585,653 | 12/1996 | Nakashiba | 257/233 |
| 5,625,210 | 4/1997 | Lee et al. . | |
| 5,668,390 | 9/1997 | Morimoto | 257/233 |
| 5,698,874 | 12/1997 | Hayashi | 257/233 |

OTHER PUBLICATIONS

"VLSI Tehcnology", S.M. Sze, Bell Laboratories, Incorporated, McGraw–Hill Book Company, 1983.

"Solid–State Imaging with Charge–Coupled Devices", Albert J. P. Theuwissen, Philips Imaging Technology, Kluwer Academic Publishers, 1995, pp. 66–69.

B. C. Burkey et al., "The Pinned Photodiode for an Interline–Transfer CCD Image Sensor", IEDM–84, 1984, Section 2.3, pp. 28–31.

*Primary Examiner*—Edward Wojciechowicz
*Attorney, Agent, or Firm*—Robert F. Hightower

[57] ABSTRACT

An image sensor (10) has an image sensing element that includes an N-type conducting region (26) and a P-type pinned layer (37). The two regions form two P-N junctions at different depths that increase the efficiency of charge carrier collection at different frequencies of light. The conducting region (26) is formed by an angle implant that ensures that a portion of the conducting region (26) can function as a source of an MOS transistor (32).

19 Claims, 1 Drawing Sheet

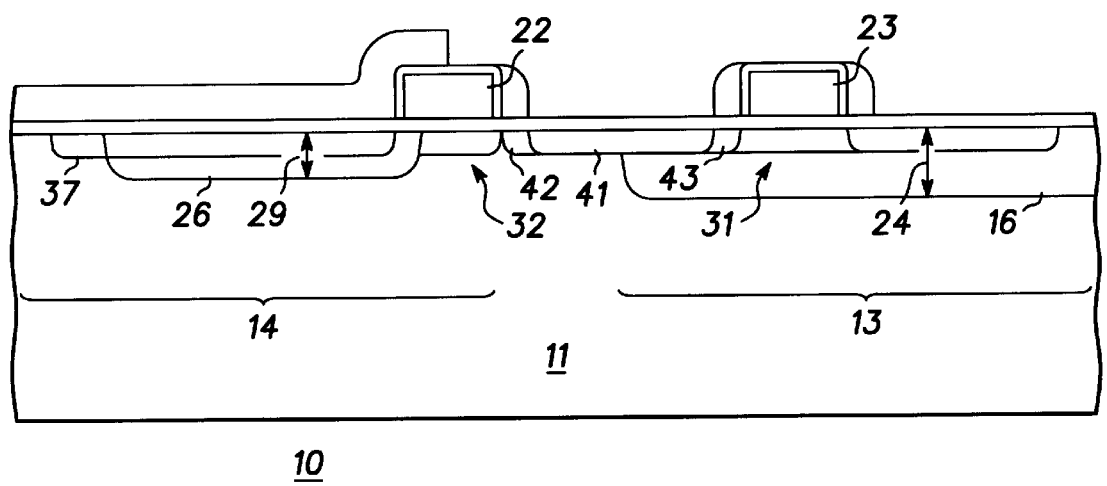

METHOD OF FORMING A SEMICONDUCTOR IMAGE SENSOR AND STRUCTURE

BACKGROUND OF THE INVENTION

This application is related to an application entitled CMOS IMAGE SENSOR by Michael Guidash filed on the same day as the instant application, and an application entitled SEMICONDUCTOR IMAGE SENSOR AND METHOD THEREFOR by Drowley et al filed concurrently herewith.

This invention relates, in general, to semiconductor devices, and more particularly to a semiconductor image sensor.

In the past, a variety of methods were used to form semiconductor image sensors on a substrate with complementary metal oxide semiconductor (CMOS) devices. Typically, the optical receiving portion of the sensor is formed either as a gate of a large area transistor, often referred to as a photo-gate or as a source-drain junction of a metal oxide semiconductor (MOS) transistor. The photo-gate transistor implementation requires that light travel through the silicon gate of the transistor in order to convert light to electrical energy. Consequently, the photo-gate implementation has reduced sensitivity. Additionally, the depletion region generally is shallow (less than one micron) thereby reducing the collection efficiency of carriers induced by red light absorption. Also conventional photo-gate implementations are susceptible to noise created by surface recombination.

The source-drain junction implementation generally has a junction that is optimized for transistor operation and therefor also has a shallow junction that results in inefficient collection of carriers induced by red light. Another disadvantage of the source-drain junction implementation is that the junction typically is formed in a highly doped (greater than $10^{16}$ atoms/cm$^3$) region that limits the width of the junction depletion region thereby further reducing the collection efficiency of carriers induced by red light absorption. Furthermore, forming the junction in such a highly doped region results in a large capacitance that reduces the amount of charge that can be transferred from the photo sensing element to other electronics.

Accordingly, it is desirable to have an image sensor that does not utilize a photo-gate thereby resulting in higher efficiency, that does not have a shallow junction depth thereby increasing efficiency, that minimizes noise from surface recombination.

BRIEF DESCRIPTION OF THE DRAWING

The sole FIGURE illustrates an enlarged cross-sectional portion of an image sensor embodiment in accordance with the present invention.

DETAILED DESCRIPTION OF THE DRAWING

FIG. 1 illustrates an enlarged cross-sectional portion of an active pixel sensor or a semiconductor image sensor 10. Sensor 10 includes an underlying P-type substrate 11. Sensor 10 has a first well or P-type well 16 formed in a first portion 13 of underlying substrate 11. Well 16 typically has a doping concentration that is higher than the doping concentration in a second portion 14 of underlying substrate 11. Portions 13 and 14 are identified by brackets. Second portion 14 forms a second well within substrate 11. The surface doping concentration of well 16 typically is at least $1\times10^{16}$ atoms/cm$^3$. A first depth or depth 24 of well 16 typically is about two to four microns in order to facilitate forming other CMOS devices on substrate 11.

The image capturing or light sensing element of sensor 10 includes an N-type conducting region 26 that is formed in second well or second portion 14. Conducting region 26 forms a first P-N junction with the P-type material of substrate 11. This first P-N junction is positioned at a second depth or depth 29 of conducting region 26 in order to readily sense light in the red wavelengths and typically is less than approximately 0.7 microns, and preferably about 0.5 microns, from the surface of substrate 11. A P-type pinning layer 37 is formed within region 26 and extends outward from region 26 into substrate 11 in order to form an electrical connection therewith. This electrical connection pins the potential applied to this element of the image sensor. Consequently, the resulting photodiode is often referred to as a pinned photodiode. A second P-N junction is formed along the intersection of layer 37 and region 26. Typically layer 37 is formed simultaneously with the formation of lightly doped drain and source regions of other P-channel MOS transistors (not shown) on substrate 11. The depth of the second P-N junction is less than that of the first P-N junction. This depth is selected to optimize the absorption or sensing of light in the blue wavelengths. A transfer transistor or first MOS transistor 32 is formed adjacent to conducting region 26 so that a portion of region 26 forms a source of transistor 32. A second or reset MOS transistor 31 is formed within well 16. Transistor 31 has a source that is electrically coupled to transistor 32 by a coupling region 41.

Conducting region 26 is formed by applying a mask having an opening that exposes some of the surface of portion 14 extending up to and including a portion of a gate 22 of transistor 32. Then dopants are implanted at an angle away from the perpendicular to substrate 11 and toward gate 22 to ensure that region 26 extends under gate 22, thereby saving masking and other processing operations in forming region 26 and the source of transistor 32.

By now it should be appreciated that there has been provided a novel image sensor and method therefor. Forming a deep conducting region and a shallower pinned layer forms two P-N junctions where one P-N junction, and the associated depletion region, is deep to facilitate capturing light in the red wavelengths and a second P-N junction, and the associated depletion region, is shallow facilitating capturing blue wavelength light. This structure also minimizes surface recombination and maximizes charge transfer. Using an angled implant to form the conducting region ensures the conducting region can be used as a source of a charge transfer transistor thereby minimizing manufacturing operations.

What is claimed is:
1. An image sensor comprising:
   a substrate of a first conductivity type having a first doping concentration;
   a first well on the substrate, the first well having the first conductivity type and a second conductivity type and a second doping concentration of the first conductivity type that is greater than the first doping concentration wherein the first well has a first depth into the substrate;
   a first MOS transistor on the substrate and spaced laterally from the first well;
   a second MOS transistor formed on the first well;
   a conducting region of a second conductivity type within the substrate and adjacent to the first MOS transistor wherein a portion of the conducting region forms a drain of the first MOS transistor and wherein the conducting region has a second depth into the substrate; and a pinning layer of the first conductivity type having a first portion formed within the conducting region and a second portion extending laterally from the conducting region in a direction away from the first MOS transistor.

2. The image sensor of claim 1 wherein the second depth is greater than a depth of the pinning layer thereby forming a first P-N junction at the first depth and a second P-N junction near an intersection of the pinning layer and the conducting region.

3. The image sensor of claim 2 wherein the second depth is less than approximately seven microns.

4. An active pixel sensor comprising:
a substrate with a surface of a first conductivity type having a first region of greater concentration of the first conductivity type and a second region of less concentration of the first conductivity type than the first;
a pinned photodiode formed adjacent to the first region in the second region;
at least one MOS transistor in the first region formed adjacent to the pinned photodiode; and
at least one MOS transistor in the second region formed such that a gate of the MOS transistor in the second region is within the second region and a drain of the MOS transistor is within the first region and the second region, and the pinned photodiode forms a portion of the MOS transistor in the second region.

5. The invention of claim 4 wherein the MOS transistor is formed such that a portion of the pinned photodiode underlies the gate to the MOS transistor.

6. The invention of claim 4 wherein a drain to the MOS transistor is in at least the second region.

7. The invention of claim 6 wherein the drain is formed such that it is in both the first region and the second region.

8. The invention of claim 4 wherein the pinned photodiode further comprises a dopant of a second conductivity type opposite the first conductivity type implanted at an angle from perpendicular to the substrate such that the dopant of the second conductivity type extends beneath a gate to the MOS transistor.

9. The invention of claim 8 wherein the pinned photodiode further comprises a conducting region at a depth that is less than 0.7 microns beneath the surface.

10. The invention of claim 9 further comprising a pinning layer of the pinned photodiode formed within the conducting region.

11. The invention of claim 10 wherein the implanted dopant of the-second conductivity type extends more beneath the gate of the MOS transistor than does the pinning layer.

12. The invention of claim 11 further comprising a second MOS transistor within the first region that is electrically coupled to the first MOS transistor.

13. A method of forming an active pixel sensor comprising the steps of:
providing a substrate with a surface of a first conductivity type and a first region of the first conductivity type;
providing a pinned photodiode in a second region of the first conductivity type, such that the second region type has a second doping concentration that is less than a first doping concentration to the first region, the pinned photodiode having a first P-N junction at a first depth from the surface and a second P-N junction at a second depth that is less than the first depth;
forming at least one MOS transistor in the first region; and
forming at least one MOS transistor in the second region, such that the pinned photodiode forms a portion of the MOS transistor in the second region, and a gate of the MOS transistor in the second region is within the second region and a drain of the MOS transistor is within the first region and the second region.

14. The method of claim 13 wherein the step of forming the portion of the MOS transistor in the second region from the pinned photodiode further comprises forming the portion such that the portion underlies the gate of the MOS transistor.

15. The method of claim 13 wherein the step of providing the pinned photodiode further comprises implanting a dopant of a second conductivity type opposite the first conductivity type, at an angle from perpendicular to the substrate to extend beneath a gate of the MOS transistor.

16. The method of claim 15 wherein the step of providing the pinned photodiode further comprises forming a conducting region at a depth that extends no greater than 0.7 microns beneath the surface.

17. The method of claim 16 further comprising forming the pinning layer within the conducting region.

18. The method of claim 17 wherein the implanted dopant of the second conductivity type extends more beneath the gate of the MOS transistor than does the pinning layer.

19. The image sensor according to claim 1 wherein the substrate and the first well are connected by an ohmic conduction path below the surface of the semiconductor.

* * * * *

UNITED STATES PATENT AND TRADEMARK OFFICE
CERTIFICATE OF CORRECTION

PATENT NO. : 6,100,556  
DATED : August 8, 2000  
INVENTOR(S) : Clifford I. Drowley, Robert M. Guidash and Mark S. Swenson It is certified that error appears in the above-identified patent and that said Letters Patent is hereby corrected as shown below:

Column 3,
Line 1, please change "drain" to -- source --.

Signed and Sealed this

Seventeenth Day of February, 2004

JON W. DUDAS
*Acting Director of the United States Patent and Trademark Office*